(12) United States Patent
Hogue et al.

(10) Patent No.: US 8,017,308 B2
(45) Date of Patent: Sep. 13, 2011

(54) PATTERNING NON-PLANAR SURFACES

(75) Inventors: Eric L. Hogue, Galloway, OH (US);
Stephen J. Krak, Newark, NJ (US);
Timothy J. Stanfield, Lewis Center, OH (US)

(73) Assignee: Battelle Memorial Institute, Columbus, OH (US)

( * ) Notice: Subject to any disclaimer, the term of this patent is extended or adjusted under 35 U.S.C. 154(b) by 1068 days.

(21) Appl. No.: 11/837,253

(22) Filed: Aug. 10, 2007

(65) Prior Publication Data
US 2008/0038677 A1 Feb. 14, 2008

Related U.S. Application Data

(60) Provisional application No. 60/822,216, filed on Aug. 11, 2006, provisional application No. 60/822,134, filed on Aug. 11, 2006.

(51) Int. Cl.
*G03F 7/24* (2006.01)
(52) U.S. Cl. ........................................................ 430/322
(58) Field of Classification Search .................. 430/322, 430/325
See application file for complete search history.

(56) References Cited

U.S. PATENT DOCUMENTS

| | | | |
|---|---|---|---|
| 3,201,238 A | 8/1965 | Dwyer | |
| 3,453,620 A | 7/1969 | Flemming et al. | |
| 3,649,394 A | 3/1972 | Erickson, Jr. | |
| 3,694,080 A | 9/1972 | Malsky | |
| 3,889,329 A | 6/1975 | Fazlin | |
| 3,907,565 A | 9/1975 | Burton et al. | |
| 3,989,524 A | 11/1976 | Palec | |
| 4,181,774 A | 1/1980 | Wendt | |
| 4,388,388 A | 6/1983 | Kornbau | |
| 4,477,814 A | 10/1984 | Brumbaugh et al. | |
| 4,497,684 A | 2/1985 | Sebstra | |
| 4,532,002 A | 7/1985 | White | |
| 4,651,009 A | 3/1987 | Totsuka | |
| 4,651,417 A | 3/1987 | Schumacher, III et al. | |
| 4,707,586 A | 11/1987 | Voss et al. | |
| 4,810,621 A * | 3/1989 | Akkapeddi et al. | 430/321 |
| 4,826,266 A | 5/1989 | Baird et al. | |
| 4,835,087 A | 5/1989 | Bielli et al. | |

(Continued)

FOREIGN PATENT DOCUMENTS

GB 2 326 276 A 12/1998

(Continued)

OTHER PUBLICATIONS

B.J. Lin, Conformable Masks, IBM J. Res. Develop. May 1976, pp. 217-218.

*Primary Examiner* — Kathleen Duda
*Assistant Examiner* — Brittany Raymond
(74) *Attorney, Agent, or Firm* — Thomas E. Lees, LLC

(57) ABSTRACT

A pattern is formed on a non-planar surface by forming a layer of photoresist on a part having a surface comprising a non-planar surface area. A deformable mask is aligned over at least a portion of the non-planar surface area of the part such that the deformable mask substantially deforms in a manner corresponding to at least a portion of the non-planar surface area of the part. The photoresist on the part is exposed through the mask so as to transfer a desired pattern onto the part while the deformable mask is maintained in a deformed state.

18 Claims, 15 Drawing Sheets

U.S. PATENT DOCUMENTS

| | | | |
|---|---|---|---|
| 4,837,129 A | 6/1989 | Frisch et al. | |
| 4,844,985 A | 7/1989 | Pharms et al. | |
| 4,871,220 A | 10/1989 | Kohin | |
| 4,944,087 A | 7/1990 | Landi | |
| 5,020,887 A | 6/1991 | Orler et al. | |
| 5,078,462 A | 1/1992 | Gravisse | |
| 5,090,122 A | 2/1992 | Kitagawa | |
| 5,119,232 A | 6/1992 | Daley et al. | |
| 5,141,829 A | 8/1992 | Dumas et al. | |
| 5,160,959 A * | 11/1992 | Everett et al. | 355/53 |
| 5,164,260 A | 11/1992 | Yoshinaka et al. | |
| 5,182,564 A | 1/1993 | Burkett et al. | |
| 5,194,985 A | 3/1993 | Hilton, Sr. | |
| 5,214,432 A | 5/1993 | Kasevich et al. | |
| 5,223,849 A | 6/1993 | Kasevich et al. | |
| 5,225,918 A * | 7/1993 | Taniguchi et al. | 359/12 |
| 5,310,598 A | 5/1994 | Yoshinaka et al. | |
| 5,327,149 A | 7/1994 | Kuffer | |
| 5,339,198 A | 8/1994 | Wheatly et al. | |
| 5,344,729 A | 9/1994 | Akins et al. | |
| 5,395,718 A | 3/1995 | Jensen et al. | |
| 5,437,091 A | 8/1995 | Norman | |
| 5,449,591 A | 9/1995 | Sato et al. | |
| 5,481,400 A | 1/1996 | Borden | |
| 5,488,371 A | 1/1996 | Targove | |
| 5,552,249 A | 9/1996 | Jensen et al. | |
| 5,567,554 A | 10/1996 | Jensen et al. | |
| 5,633,105 A | 5/1997 | Jensen et al. | |
| 5,650,249 A | 7/1997 | Dull et al. | |
| 5,745,989 A | 5/1998 | Fisher et al. | |
| 5,776,612 A | 7/1998 | Fisher | |
| 5,855,988 A | 1/1999 | Matsuo | |
| 5,858,496 A | 1/1999 | Fisher et al. | |
| 5,905,007 A | 5/1999 | Ho et al. | |
| 6,086,979 A | 7/2000 | Kanabara et al. | |
| 6,103,640 A | 8/2000 | Yoshikawa et al. | |
| 6,104,534 A | 8/2000 | Ohta et al. | |
| 6,194,127 B1 | 2/2001 | Stolk et al. | |
| 6,195,034 B1 | 2/2001 | Tsuno et al. | |
| 6,210,787 B1 | 4/2001 | Goto et al. | |
| 6,391,502 B1 | 5/2002 | Anderson et al. | |
| 6,416,908 B1 | 7/2002 | Klosner et al. | |
| 6,504,501 B2 | 1/2003 | Togashi et al. | |
| 6,518,936 B1 | 2/2003 | Dull | |
| 6,542,218 B2 | 4/2003 | Anderson et al. | |
| 6,591,496 B2 | 7/2003 | Koskenmaki et al. | |
| 6,733,869 B2 | 5/2004 | Arakawa et al. | |
| 6,891,517 B2 | 5/2005 | Voeltzel | |
| 2001/0005184 A1 | 6/2001 | Tsuno et al. | |
| 2003/0042045 A1 | 3/2003 | Koskenmaki et al. | |
| 2003/0164243 A1 | 9/2003 | Arakawa et al. | |
| 2004/0116013 A1 | 6/2004 | Yoshida et al. | |
| 2004/0200821 A1 | 10/2004 | Voeltzel | |
| 2004/0222003 A1 | 11/2004 | Kim et al. | |

FOREIGN PATENT DOCUMENTS

| | | |
|---|---|---|
| GB | 2326276 A | 12/1998 |
| JP | 56 123379 A | 9/1981 |
| JP | 61 119683 A | 6/1986 |
| JP | 63 216335 A | 9/1988 |
| JP | 02 287354 A | 11/1990 |
| JP | 02287354 A | 11/1990 |
| JP | 05 163589 A | 6/1993 |
| JP | 05163589 A | 6/1993 |

* cited by examiner

PATTERNING NON-PLANAR SURFACES

CROSS REFERENCE TO RELATED APPLICATIONS

This application claims the benefit of U.S. Provisional Patent Application Ser. No. 60/822,216, filed Aug. 11, 2006, entitled "PATTERNING NON-PLANAR SURFACES", the disclosure of which is hereby incorporated by reference. This application also claims the benefit of U.S. Provisional Application Ser. No. 60/822,134 filed Aug. 11, 2006, entitled "PATTERNING COMPOSITIONS, MASKS AND METHODS" the disclosure of which is hereby incorporated by reference.

BACKGROUND OF THE INVENTION

The present invention relates in general to contact lithography techniques and, more particularly, to contact lithography systems and methods that utilize deformable masks for patterning non-planar surfaces.

In conventional contact photolithography, a substrate having a flat or flattened surface is coated with a photoresist material. A flat glass mask is then aligned over the photoresist material and is brought into intimate contact with the substrate. The flat mask includes a mask pattern defined by areas of the mask that are opaque to light emitted by an ultra violet (UV) lamp or other suitable exposure source, and areas of the mask that are transparent to light from the UV lamp. An exposure operation is then performed whereby the photoresist material on the substrate is selectively exposed to light from the UV lamp through the flat glass mask. In particular, the light emitted by the UV lamp transmits through the transparent portions of the mask and penetrates the photoresist material below. The photoresist material is photosensitive to the light, thereby altering the chemical resistance of those exposed regions of the photoresist material to a corresponding developer. The changed resistance regions of the photoresist material are referred to herein as the exposed regions. The areas of the mask that are opaque block the light from the UV lamp from altering those regions of the photoresist material corresponding to the opaque areas of the mask, thus defining unexposed regions of photoresist material.

A subsequent developing process is then performed, whereby the developer is used to remove either the exposed regions or the unexposed regions of photoresist material from the substrate, resulting in a pattern in the remaining photoresist material corresponding to the pattern on the mask. In this regard, the corresponding pattern may be a positive or negative image of the mask pattern, depending upon whether the developing process removes the exposed or unexposed regions of the photoresist material. Once the pattern is prepared in the photoresist material, any number of conventional processes may be carried out. For example, subsequent deposition or etching processes may be performed as the specific application requires.

Photosensitive compounds are capable of producing patterns having a relatively fine feature size. However, as the desired feature size gets smaller, it becomes increasingly important for intimate contact to be made between the photomask and the substrate. For example, at the edges of the pattern, light is scattered and diffracted. Accordingly, if sufficiently intimate contact between the photomask and the photoresist material is not achieved, then it is possible for regions of the photoresist that are intended to be unexposed, e.g., regions of the photoresist that are proximate to the opaque edges of the pattern, to unintentionally become exposed, thus resulting in an inaccurate transfer of the pattern from the mask to the substrate.

There are an increasing number of applications where it is desirable to pattern non-planar surfaces. For example, many frequency selective surfaces such as those found on radomes, windows, the receiving surfaces of RF antennas, etc., are non-planar surfaces that may require a micromesh or other suitable pattern applied thereto. However, any curvature in the surface complicates the patterning process and makes the achievement of precise patterns difficult. Moreover, a flat glass mask may not be capable of projecting a useful image onto a non-planar substrate. For example, as the resolution and size of the lines in the pattern are reduced, it may become extremely difficult to use a flat mask due to the distortion introduced from a lack of intimate contact between the mask and the non-planar portion of the corresponding substrate that is to be patterned.

SUMMARY OF THE INVENTION

According to an aspect of the present invention, a method of forming a pattern on part comprises forming a layer of photoresist on a part having a surface comprising a complex non-planar surface area and positioning the part within a chamber defined by a chamber base and a pressure vessel such that the part is positioned within the chamber base, wherein a first pressure source is coupled to the chamber base and a second pressure source is coupled to the pressure vessel. The method further comprises securing a deformable mask in a retaining device between the chamber base and the pressure vessel so as to align the deformable mask towards the photoresist on the part and divide the chamber into a pressure vessel space above the mask and a chamber base space below the mask, drawing a first vacuum in the chamber base space using the first pressure source, applying a positive pressure in the pressure vessel space using the second pressure source to deform the mask to correspond substantially to the part including the complex non-planar surface area and exposing the photoresist on the part through the mask after the mask deforms to correspond to the part including the complex non-planar surface area. The method still further comprises removing the part from the chamber and developing the photoresist on the part.

According to another aspect of the present invention, a method of forming a pattern on a non-planar surface of a part comprises deforming a mask against a mold, bringing the mask into cooperation with a part to be patterned while the mask is deformed against the mold, wherein the part has at least one non-planar surface area coated with a photoresist layer and pulling a vacuum between the mask and the part such that the mask deforms to the part including the at least one non-planar surface area. The method further comprises removing the mold from the mask so that the mask remains deformed to the part, exposing the part through the mask and developing the part.

According to yet another aspect of the present invention, a method of making a deformable mask for contact lithography comprises applying photoresist over a deformable mask substrate and shaping the mask substrate to a first predetermined shape by wrapping the mask substrate about a frame. The method further comprises applying a master having desired artwork thereon over the photoresist on the deformable mask substrate, exposing the photoresist using an exposure source to define a desired pattern while the deformable mask is in the first predetermined shape and forming the pattern in the photoresist by removing portions of the photoresist corresponding to a desired pattern, wherein the deformable mask does not retain a shape corresponding to a part having a non-planar surface area to be patterned by the deformable mask.

According to yet a further aspect of the present invention, a system for forming a pattern on a non-planar surface of a part comprises a chamber base, a pressure vessel and a retaining device that is positionable between the chamber base and the pressure vessel to secure a deformable mask therebetween, wherein a chamber is defined in the inside space defined by the chamber base and the pressure vessel. The system further comprises a first pressure source coupled to the chamber base operable to provide a negative pressure within the chamber to draw the mask towards a part installed within the chamber base, a second pressure source coupled to the pressure vessel to provide a positive pressure within the pressure vessel to direct the mask towards the part so that the mask corresponds to at least one non-planar surface of the part and a third pressure source coupled to the pressure vessel to provide a negative pressure within pressure vessel, e.g., to promote adjustment of the mask relative to the part, wherein an exposure source is utilized to expose the part through the mask while the mask is in a deformed state.

According to yet a further aspect of the present invention, a system for forming a pattern on a non-planar surface of a part comprises a chamber base for holding a part having at least one non-planar surface area to be patterned, a pressure vessel that detachably connects to the chamber base and a retaining device between the chamber base and the pressure vessel to secure a deformable mask therebetween, wherein a chamber is defined in the inside space defined by the chamber base and the pressure vessel. The system further comprises at least one of a mold or a backing device within the pressure vessel corresponding to a desired shape to deform the mask before engaging the mask with the part, a first pressure source coupled to the chamber base operable to provide a pressure within the chamber in the chamber base to draw the mask towards a part installed within the chamber base and a second pressure source coupled to the pressure vessel to provide a pressure within the pressure vessel to deform the mask in cooperation with the mold or backing device.

According to yet another aspect of the present invention, a method of patterning a part comprises preparing a part having areas transmissive to an exposure source and areas that are not transmissive to the exposure source to define a desired mask pattern. The method further comprises coating the part with a layer of photoresist, exposing the photoresist through the part and developing the photoresist after exposure to the exposure source.

BRIEF DESCRIPTION OF THE SEVERAL VIEWS OF THE DRAWINGS

The following detailed description is best understood when read in conjunction with the following drawings, where like structure is indicated with like reference numerals, and in which.

DETAILED DESCRIPTION OF THE INVENTION

In the following detailed description of the illustrated embodiments, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of various embodiments of the present invention.

General System Overview

Figure 1:
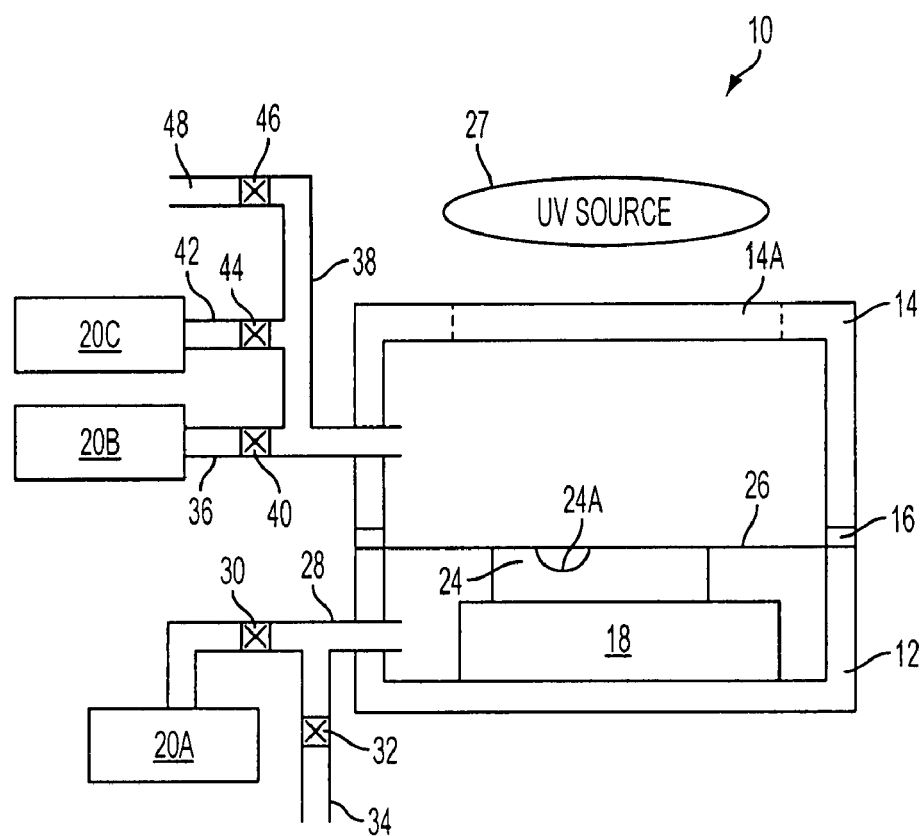
FIG. 1 is a schematic block diagram of system for applying a deformable mask to a curved surface for contact lithography.

Referring now to the drawings, and particularly to FIG. 1, a system 10 is illustrated in schematic block diagram form, which is suitable for performing contact lithography on parts having non-planar surfaces. As shown, the system 10 defines a chamber having a first chamber component, also referred to herein as the chamber base 12 and a second chamber component, also referred to herein as a pressure vessel 14. The system 10 further comprises a retaining device 16, a platform 18 and at least two pressure sources, which are designated generally by the reference numeral 20. As shown, the system 10 comprises a first pressure source 20A coupled to the chamber base 12, a second pressure source 20B coupled to the pressure vessel 14 and a third pressure source 20C, which is also coupled to the pressure vessel 14.

In use, a part 24 comprising a non-planar surface area 24A is placed on the platform 18. As illustrated, the non-planar surface area 24A is a dimple that recesses into the part 24. However, in practice, the non-planar surface area 24A can be any surface of the part 24 that is non-planar, e.g., stepped, curved, complex including complexly curved, or having any other contour(s). As used herein, a complex non-planar surface area differs from a simple non-planar surface area in that a complex area has multiple changes such as relatively steep contour changes, abrupt or otherwise sharp angles, steps, dimples, recesses and/or other features that is not merely a simple curvature. As a further example, complex curvature differs from a simple curvature in that a complex curvature comprises at least one change in the center of curvature in the non-planar surface area 24A of the part 24.

A deformable mask 26 is secured in the retaining device 16. The retaining device 16 comprises any suitable structure for holding the mask 26, and may pre-stretch or otherwise alter the shape of the mask 26 from a default state. The retaining device 16 may also allow adjustments to be made to the positioning of the mask 26, e.g., to perform suitable alignment procedures. In its default state before use, the mask 26 is generally not conformal to the part 24. However, as will be described more fully herein, the mask 26 need not be flat.

Prior to an exposure operation, the pressure sources 20 may be operated so as to work together, e.g., to provide a differential pressure or to operate in sequence, to deform the mask 26 in a manner corresponding to the part 24, including the non-planar surface area 24A, which may be complexly shaped. Once the mask 26 has satisfactorily deformed corresponding to the contour(s) of the part 24, an exposure operation is performed, e.g., by positioning an exposure source 27 such as an ultraviolet (UV) exposure lamp over the vessel 14, by moving the system 10 under a suitable UV exposure lamp or by otherwise positioning an exposure source 27 so as to expose the part 24 through the mask 26. Regardless of the approach utilized to bring the exposure source 27 into cooperation with the system 10, an exposure occurs while the mask 26 is maintained in a deformed state corresponding to the part 24 as will be described in greater detail below.

In an exemplary implementation of the system 10, the chamber base 12 comprises a stainless steel vacuum chamber that supports the retaining device 16 and the platform 18. The pressure vessel 14 may comprise at least a portion 14A that is transmissive to light from the exposure source 27. For example, the portion 14A of the pressure vessel 14 may comprise a quartz window. Alternatively, the portion 14A of the pressure vessel 14 may comprise acrylic or other material that is sufficiently transparent to the exposure source 27, e.g., a suitable UV lamp. As yet a further example, it may be possible to remove the pressure vessel 14 and maintain the mask 26 in a sufficiently deformed position to perform the exposure operation without requiring the exposure source 27 to penetrate the pressure vessel 14, an example of which will be described in greater detail herein. In a system configuration where the pressure vessel 14 is removed for the exposure operation, there may be no need to include a portion 14A that is transmissive to the exposure source 27.

In contact lithography, intimate contact of the mask 26 to the part 24 becomes increasingly important as feature size decreases. As such, the desired feature size, the size of the part 24, the specific contours of the non-planar surface area 24A, the pliability of the mask 26, the specific construction of the chamber base 12, vessel 14, retaining device 16 and similar considerations may determine the selection of the pressure sources 20. Such considerations may include, for example, whether each pressure source is a positive pressure source, such as nitrogen, or a negative pressure source, such as a vacuum pump. Other such considerations may comprise the particular number of pressures sources 20 coupled to the system 10, and whether each pressure source 20 couples to the chamber base 12 or the pressure vessel 14.

As used herein, the term "positive pressure" refers to a "pushing" pressure, i.e., a force acting on a surface. For example, when the mask 26 is held by the retaining device 16 and the pressure vessel 14 and retaining device 16 are assembled to the chamber base 12, the mask 26 defines a surface that divides a pressure vessel space above the mask 26 from a chamber base space below the mask 26. In this context, a positive pressure source, such as nitrogen, can be used within the pressure vessel 14 to urge, i.e., push, the mask 26 towards a part to be patterned in the chamber base so as to assist in deforming the mask 26 to correspond to the part 24.

The term "negative pressure" is used herein to refer to a relative pressure, such as a pressure that exerts a force (relatively) less than a different force applied to the opposite side of a corresponding surface. For example, when the mask 26 is held by the retaining device 16 and the pressure vessel 14 and retaining device 16 are assembled to the chamber base 12 as described above, if a vacuum is drawn in the chamber base space below the mask 26, the force on the mask 26 in the chamber base space is less than (and thus may be considered negative with respect to) the force applied to the mask 26 in the pressure vessel space. In this example, it may appear that the mask 26 is being "pulled" towards the chamber base space rather than pushed from the pressure vessel space. As such, this pressure difference may be conceptualized as a negative pressure.

Thus, for purposes of discussion herein, the term "positive pressure" may refer to a pressure that exerts a force greater than the ambient pressure inside the chamber when the mask 26 is held by the retaining device 16 and the pressure vessel 14 and retaining device 16 are assembled to the chamber base 12, e.g., atmosphere or some other suitable pressure. Correspondingly, the term "negative pressure" may refer to a pressure that exerts a force less than the ambient pressure inside the chamber when the mask 26 is held by the retaining device 16 and the pressure vessel 14 and retaining device 16 are assembled to the chamber base 12.

Still further considerations for selecting the type and/or quantity of pressure sources 20 may include the manner and method in which the pressure sources 20 are operated. For example, the various pressure sources 20 may be utilized in cooperation with each other to perform the necessary exposure operations. In this regard, the pressure sources 20 may be used alone or in combination, and in any sequence. Thus, at any given time during processing, no pressure sources 20 may be in use, only a single pressure source 20 may be in use, or multiple pressure sources 20 may be simultaneously in use. Some examples of the manner of using multiple pressure sources 20 will be provided in greater detail herein.

In the exemplary system 10, the first, second and third pressure sources 20A, 20B, 20C comprise a combination of positive and negative sources of pressure that are configured such that a difference in pressure can be established within the volume of the chamber base 12 and the pressure vessel 14. In one exemplary arrangement of the system 10, the first pressure source 20A comprises a vacuum source that is coupled to the chamber base 12 by a suitable first passageway 28. A first passageway control valve 30 is provided for controlling the vacuum applied within the chamber base 12. A first relief control valve 32 may also be provided to direct the pressure from the chamber base 12 to a first relief passageway 34. The first relief passageway 34 allows the pressure in the chamber to be exhausted, e.g., to atmosphere via the chamber base 12, first passageway 28 and the first relief passageway 34.

The second pressure source 20B comprises a positive pressure source, such as a compressed gas, e.g., nitrogen, which is coupled to the pressure vessel 14 by a suitable second passageway 36 and a vessel common passageway 38. A second passageway control valve 40 is provided for controlling the pressure applied within the pressure vessel 14 via the second pressure source 20B. The third pressure source 20C comprises a vacuum source that is coupled to the pressure vessel 14 via a third passageway 42 and the vessel common passageway 38. A third passageway control valve 44 is provided for controlling the pressure applied to the pressure vessel 14 via the third pressure source 20C. A second relief control valve 46 may also be provided to direct pressure in the pressure vessel 14 to a second relief passageway 48. The second relief passageway 48 allows pressure in the chamber to be relieved, e.g., to atmosphere via the pressure vessel 14, the vessel common passageway 38 and the second relief passageway 48. In practice, various combinations of valves, ports, passageways and other control arrangements may be provided to selectively apply, control and exhaust the first, second and third pressure sources 20A, 20B, 20C to and from the chamber, including the chamber base 12 and the pressure vessel 14.

As illustrated by the exemplary part 24, the non-planar surface area 24A comprises a relatively deep dimple that includes sharp changes of the surface contour of the part 24 along the perimeter of the dimple. Moreover, the curvature of the dimple extends relatively far down into the part 24. To pattern the surface of the part 24, including patterning within the non-planar surface area 24A, a previously patterned mask 26 is secured within the retaining device 16 and is positioned over the part 24 to be patterned. Although the mask 26 is shown as being substantially flat in its initial state, other arrangements can be used, including the application of some degree of pre-chamber shaping of the mask 26, such as by using a backing device or mold as will be described in greater detail herein.

Once the mask 26 is secured within the retaining device 16 and is properly placed, the pressure sources 20 are applied, alone or in combination and in any appropriate sequence, as the specific application requires. Examples of controlling the pressure sources 20 will be described in greater detail below. The pressure sources 20 deform the mask 26 to correspond to the part 24. In this regard, the mask 26 may deform without significantly corrupting the integrity of the pattern on the mask 26, e.g., without causing breaks in the pattern or tearing of the mask substrate, etc., as will be described in greater detail herein.

The Mask

The mask 26 utilized with the system 10 is constructed so as to be deformable, at least to some degree. The amount of tolerable deformation of the mask 26 will depend upon factors such as the size of the mask 26, properties of the material selected for the substrate of the mask 26, the particular geometry of the desired pattern on the mask 26 and the properties of the material of the opaque layer of the mask 26. For example, the mask 26 may be either elastic or inelastic depending upon the particular application. That is, in some applications, it may be sufficient for the mask 26 to bend or flex to conform to the part 24, without stretching the substrate of the mask 26. Moreover, the mask 26 may be constructed for a one-time use, or it may be possible to reuse the mask 26 depending upon a number of factors, including the processing conditions, as is discussed in greater detail below.

Figure 2:
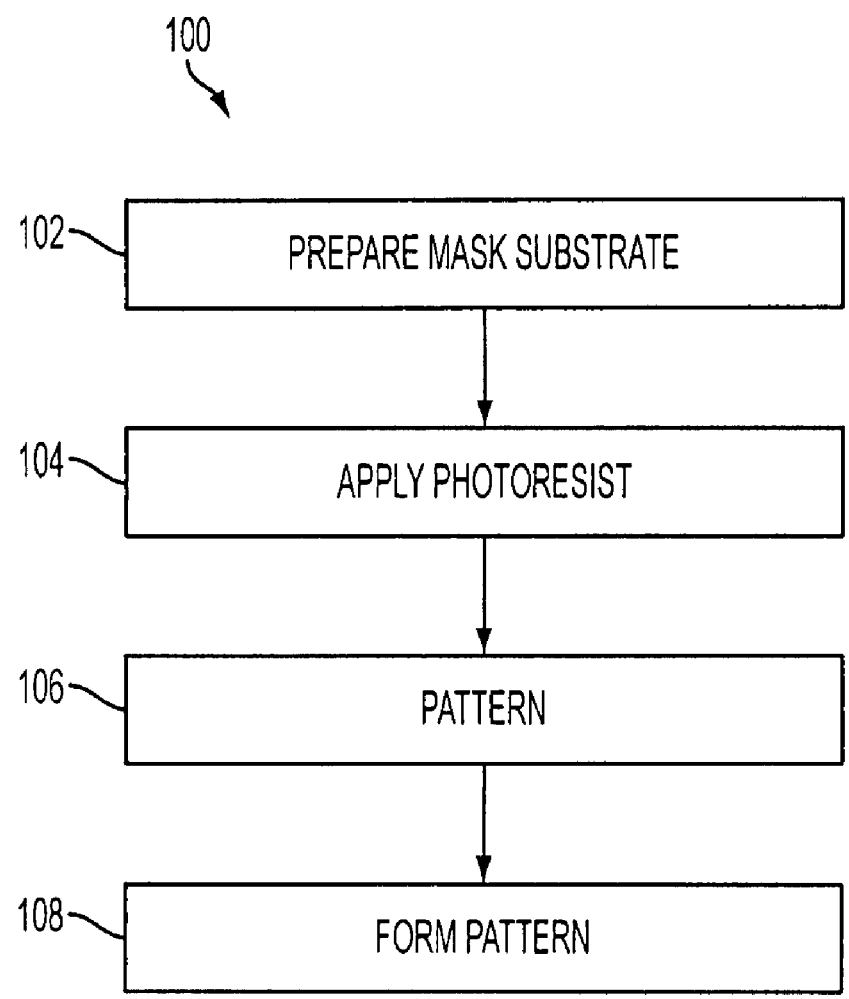
FIG. 2 is a flow chart illustrating a method of creating a deformable mask for performing contact lithography on a substrate having a non-planar surface.

With reference to FIG. 2, an exemplary method 100 is illustrated for creating a mask 26. The mask substrate is prepared at 102. The preparation required to construct a mask 26 will depend largely upon the materials selected for the mask 26. For example, the mask 26 may comprise a polymer. As such, an opaque coating, e.g., a metal, paint, varnish or other coating may need to be applied to a surface of the polymer. In one exemplary application, the mask substrate comprises a Mylar film. Thus, the preparation at 102 may comprise an optional process to aluminize the Mylar. Other preparation at 102 may comprise sizing the Mylar, cleaning or otherwise preparing the surface of the Mylar (or other material) to act as a suitable mask, etc.

Photoresist is applied to the mask 26 at 104. The photoresist may be applied using any appropriate method, such as spin-coating or spray coating. For example, an aluminized Mylar substrate may be attached to a plate of glass such that the aluminum coated side is opposite the glass plate surface, i.e., facing out, and a spin-coat method may be used to coat the aluminum side of the aluminized Mylar substrate while the mask 26 is held by the plate of glass. Other techniques for applying the photoresist may alternatively be used. Also, a bake operation may be performed immediately after the application of photoresist (soft bake) to remove residual solvents from the photoresist.

The mask is patterned at 106. For example, if the aluminized Mylar is provided as a substantially flat sheet, the desired pattern may be transferred from a standard glass photomask master to the photoresist over the aluminum side of the aluminized Mylar substrate. The glass photomask master may be held tightly against the photoresist on the substrate using any suitable method, such as by using a vacuum. As an example, the edges of the flat glass photomask master may be sealed, and a needle that is attached to a vacuum pump may be used to draw the air out from between the glass photomask master and the resist coated mask 26.

Once the glass photomask master is sufficiently positioned with respect to the substrate of the mask 26, the photoresist on the mask 26 is selectively exposed by an exposure source, e.g., using a UV lamp or mask aligner, in a manner corresponding to the pattern from the glass photomask master. The glass photomask master is removed and the photoresist on the mask 26 is developed, e.g., using a suitable developer, to create the desired pattern in the photoresist on the mask 26 corresponding to the pattern provided on the glass photomask master. After the exposure operation, a post exposure bake may be required, e.g., to complete a chemical change of the photoresist on the mask 26. After baking or other necessary treatments (if required), a developing process is performed, such as by spraying or otherwise washing the photoresist from the substrate using a chemical developer solution. If the photoresist is a positive resist, the portions of the photoresist that were exposed to light from the exposure source are removed by the developer. If the photoresist is a negative resist, the non-exposed photoresist is removed from the mask 26.

A pattern forming operation is then performed at 108. For example, a standard wet etch process may be used to remove the metal, e.g., aluminum in the present example, from the areas where there is no photoresist. The mask substrate, e.g., the aluminized Mylar thus now comprises a copy of the pattern that was on the glass master with the metal remaining on the Mylar creating the opaque pattern. The copy will be either a positive copy or a negative copy of the pattern on the glass photomask master depending upon the resist that is used.

As yet another example, a lift-off operation may be used to form the pattern on the mask 26 at 108, which avoids the requirement of etching previously deposited aluminum. Using the lift-off technique, the aluminum is not applied to the Mylar during the preparation step at 102. Rather, the photoresist is applied to the Mylar at 104 and is patterned at 106 in a manner analogous to that described above. During pattern forming at 108, a layer of aluminum is applied over the patterned resist coated Mylar and a lift-off operation is performed to remove the photoresist and corresponding aluminum from the Mylar, leaving a pattern of aluminum. For example, the mask 26 may be rinsed with a solvent that removes the photoresist and the excess metal that is applied to the top of the photoresist, leaving only the metal that was deposited onto the Mylar in the "cleared" patterned areas of the photoresist on the mask 26.

The processing requirements, the exposure source, and the size and shape of the part to be patterned will influence the selection of mask materials. For example, typical parts 24 may range in size from relatively small, e.g., approximately one inch (approximately 2.54 cm) or smaller in at least one dimension, to relatively large, e.g., up to approximately eight feet (approximately 2.44 m) or greater in at least one dimension. Moreover, the feature size of the pattern is generally independent of the physical dimensions of the part 24, thus very large parts may require microscopic lines patterned into the part. Still further, the pattern on the mask may transparent, at least in a manner that is commensurate with the spectrum associated with the corresponding exposure source 27.

Scanning Exposure Methods

Figure 3A:
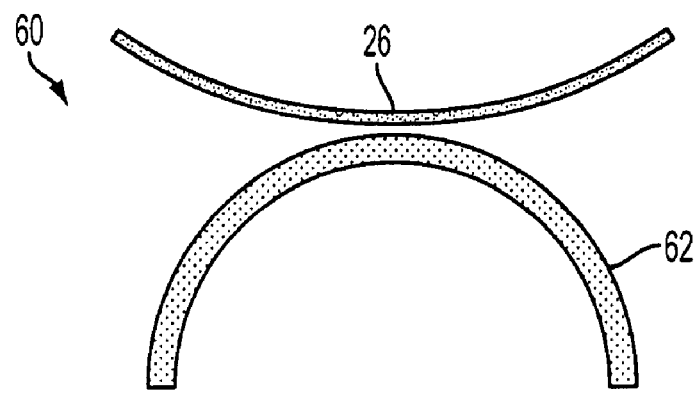
FIGS. 3A-3D are schematic diagrams of a system for performing an indexed exposure, showing by way of example, the indexed exposure of a photomask wrapped around a cylinder.

As noted herein, the parts to be patterned may be quite large in size, e.g., up to and exceeding 8 feet (approximately 2.44 m). As such, it may be impractical or impossible to perform the exposure in a single step or pass. According to one aspect of the present invention, and with reference to FIGS. 3A-3D, a multi-pass exposure approach is illustrated for creating the mask 26. As schematically shown in FIG. 3A, the system 60 comprises a frame base 62 upon which the mask substrate is applied. As shown, the frame base 62 comprises a generally semi-cylindrical shape for clarity of discussion herein. However, in practice, the frame base 62 may be implemented using any suitable shape.

Figure 3B:
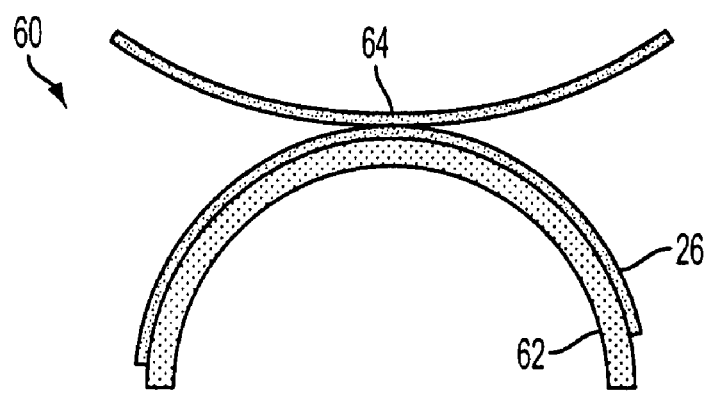
Figure 3C:
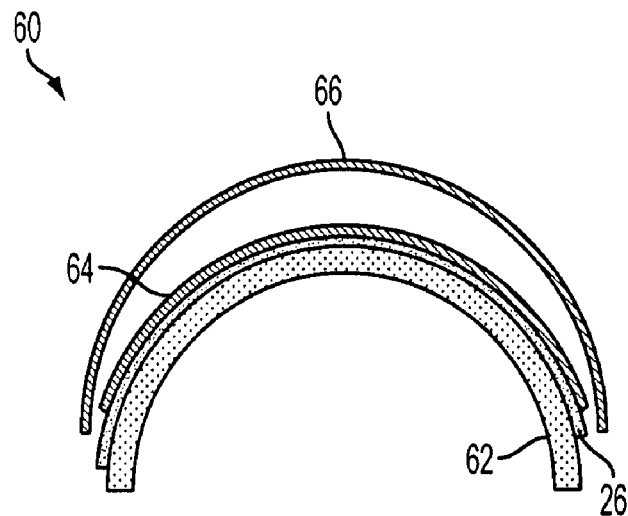
Figure 3D:
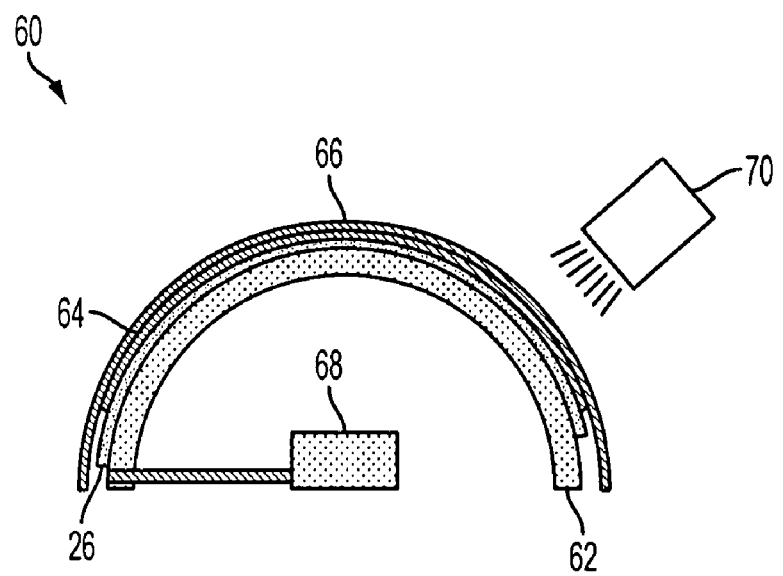

With reference to FIG. 3B, a film master 64, e.g., a film containing the original artwork, is flexed or otherwise bent over the mask 26. With reference to FIG. 3C, a transparent top layer 66, such as an acrylic sheet, may then applied over the film master 64. Referring to FIG. 3D, the top sheet 66, the film master 64 and mask 26 are secured sufficiently together for an exposure operation. As an example, a vacuum may be drawn, e.g., from a suitable vacuum source 68 while an exposure operation is performed to expose the mask 26 through the film master 64 and transparent top layer 66 using a suitable exposure source 70. The exposure source 70 can be indexed about the frame base 62 in a manner that results in a suitable, uniform exposure of the mask 26. For example, the exposure source 70 may be turned on and swept in any suitable direction so as to emit a light beam that is normal to the surface of the mask 26 in a manner that a substantially uniform exposure is achieved.

Alternatively, the exposure source 70 may be arranged in a stationary position and the frame base 62 may be moved relative to the exposure source 60. For example, the frame base 62 may be placed on a translation table or otherwise comprise translation and/or rotational capabilities that allow the frame base 62 to move relative to the exposure source 60 in at least one direction. Under this arrangement, the frame base 62 is indexed to advance the mask 26 relative to the exposure source 70. Still further, the exposure operation may be carried out by a combination of translation or other motion in both the frame base 62 and the exposure source 70.

Figure 4:
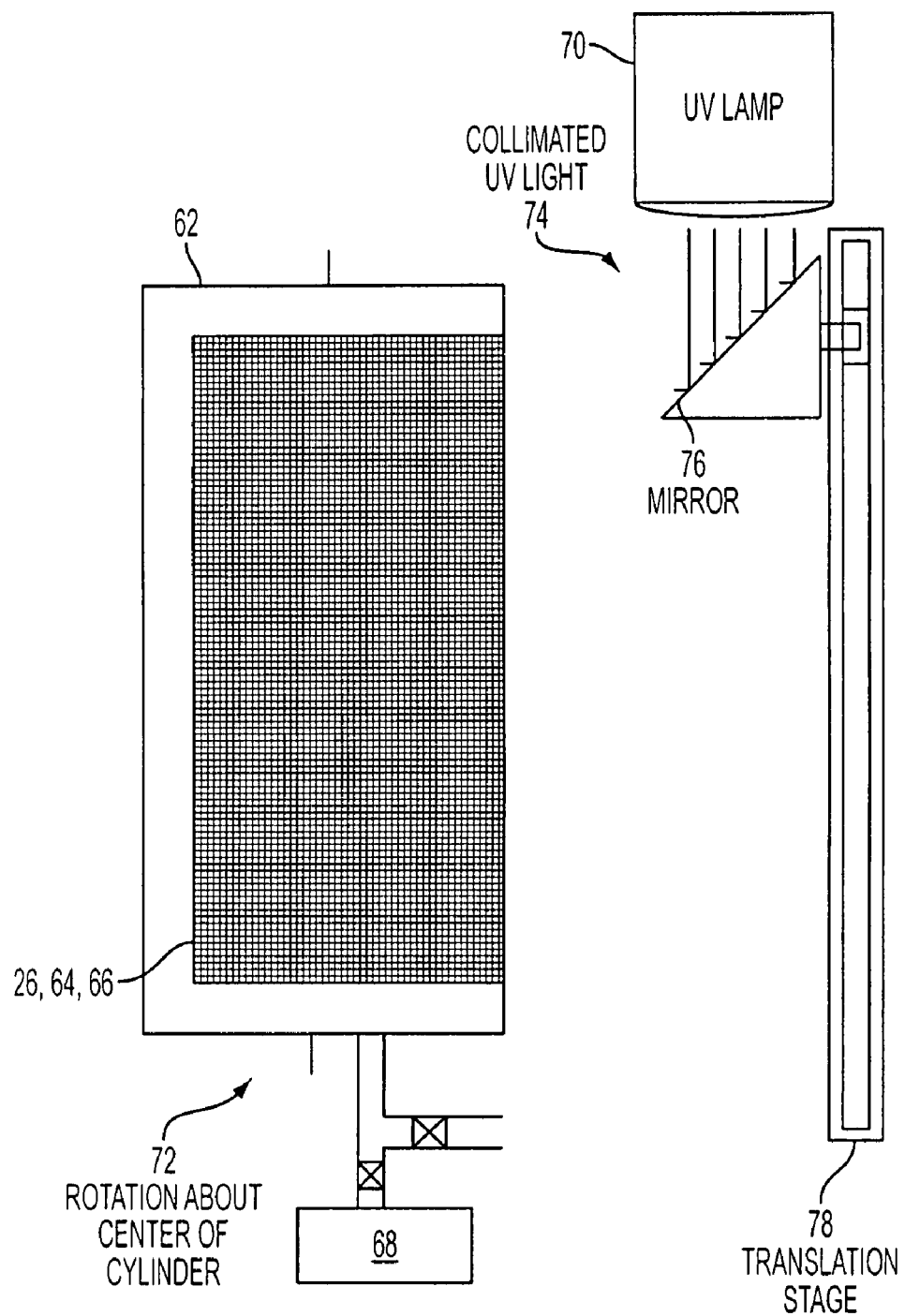
FIG. 4 is a schematic diagram of a system for performing an indexed exposure.

Referring to FIG. 4, in another exemplary implementation of the system 60, the frame base 62 comprises a predetermined shape, such as a cylinder, having a longitudinal axis 72 about which the frame base 62 may rotate. The mask 26 is bent to conform to the outer surface of the frame base 62 in a manner analogous to that described above with reference to FIGS. 3A-D. A master film 64 having the desired artwork is applied over the mask 26, and a top layer 66, e.g., an acrylic sheet, is provided over the master film 64. The top sheet 66, the film master 64 and mask 26 are then secured sufficiently together for an exposure operation. As an example, a vacuum may be drawn from a suitable vacuum source 68 to hold the mask 26, the master film 64 and the top layer 66 in sufficient contact for exposure.

The exposure source 70, e.g., a UV lamp, is provided a fixed location relative to the frame base 62. Light 74 from the UV lamp is directed towards a reflective device 76, e.g., a mirror, which reflects the light towards the surface of the frame base 62, thus exposing the mask 26. As shown, the reflective device 76 directs the light towards the frame base 62 in a direction that is generally normal to the surface of the top layer 66. The reflective device 76 is used to index the path of the beam of light 74 from the UV source 70 to the frame base 62. As such, the system further includes a translation stage 78 that is provided for causing the reflective device 76 to translate along the longitudinal length of the frame base 62. Thus, the combination of translation of the reflective device 76 along the translation stage 78, and the rotation of the frame base 62 about its longitudinal axis 72, allows the mask 26 to be uniformly exposed, even where the mask 26 is relatively large.

The system 60, as illustrated with reference to FIGS. 3A-3D; and 4 may be useful, for example, where flood exposure is unsatisfactory due to the particular circumstances of the application, e.g., size of the mask/part etc. Also, by translating at least one of the exposure source 70 (or corresponding reflective device 76 and translation stage 78), or by moving the frame base 62, a uniform exposure light coverage can be realized by maintaining the beam 74 emitted from the exposure source 70 substantially normal to the surface of the mask 26. However, still further arrangements can be implemented within the spirit of the present invention that provide for selective exposure. For example, a laser direct-write method can be used, e.g., by utilizing an appropriate multi-axis gantry and by using a laser to direct-write the pattern into the photoresist applied to the mask 26.

As noted above, other materials in addition to, or in lieu of, aluminized Mylar may be used to form the mask 26. The particular material should be selected so as to be capable of surviving the particular processing conditions. For example, the mask 26 should be able to be deformable (elastically or in-elastically) within the requirements of the part 24 to be patterned. More particularly, the mask substrate may be stretched in certain applications from approximately 5%, up to and exceeding 100% of the size of the non-stretched mask substrate material. The amount of required stretching may affect the selection of mask substrate materials.

During use, it may be desirable to deform the mask 26 so as to not exceed the elastic limits of the mask substrate. However, the masks 26 created as set out herein may be re-used, even if a mask 26 is deformed past its elastic limits. For example, there may be enough elasticity left in the material to deal with part-to-part variations. Part to part variation is compensated for because each use of the mask 26 allows the mask 26 to adapt and conform to the part 24 so as to compensate for part variances in dimensions.

Moreover, the selected material(s) utilized to construct the mask 26 should be able to be patterned to include opaque portions that block the light from the corresponding exposing light source, and transparent portions that allow light from the exposing light source to pass through. However, the opaque layer does not require a metal layer. Rather, paint, varnish or other coatings may be applied. Under this arrangement, the pattern in the mask 26 may be formed using laser ablation or other suitable fabricating techniques. Moreover, a suitable mask 26 may be formed using the techniques as set out in greater detail in U.S. Provisional Application Ser. No. 60/822,134 filed Aug. 11, 2006, entitled "PATTERNING COMPOSITIONS, MASKS AND METHODS", which is incorporated by reference herein.

When preparing the mask 26, compensation to the artwork may also be useful to pattern the mask 26 in such a way as to account for line widths and line spacing when the mask 26 is deformed. For example, a mask 26 may be physically capable of conforming to a corresponding part 24, e.g., by recessing into the deep dimple in the non-planar area 24A of the part 24 shown in FIG. 1. However, such drastic stretching may affect the line widths of the pattern such that the lines are no longer within a predetermined tolerance as may be required by a specific application. As such, by altering the artwork applied to the mask 26 as part of the patterning process, some or all of the error may be compensated for so that as the mask 26 is deformed, the changes to the pattern do not fall outside of a predetermined specification. The specific application and the required precision of the pattern applied to the part 24 will likely determine the manner in which the artwork is prepared.

At the end of the method 100 described with reference to FIG. 2, the mask 26 may remain in its default shape, e.g., a substantially flat sheet, or the mask 26 may be in some other shape. For example, there may be some amount of stretching or deformation of the mask 26 as a result of mask processing, e.g., as a result of being flexed around the frame base 62 during mask patterning, etc. Shaping of the mask 26 as a part of mask processing need not require that the shape of the mask 26 conform to the shape of intended corresponding part 24 during mask patterning. As noted above, the mask 26 may be wrapped about a cylinder, or take on other shapes as necessary to facilitate processing.

Alternatively, the mask 26 may have been processed in a substantially flat state, or the elastic limits of the mask 26 may not have been exceeded by the pre-pattern processing. Thus, after the pattern is formed at 108, the mask 26 may return to (or remain in) its default shape, e.g., a substantially flat sheet, or the mask 26 may retain some other shape. Regardless, the mask 26 will be deformed during processing of the part 24 as will be described below. This allows the mask 26 to accommodate non-planar surfaces on a given part 24 to be patterned, to accommodate part to part variations between instances of parts 24 during processing and/or to allow the tolerance in the part itself to be opened up, if the specific application allows for such. The deformation of the mask 26 for patterning a part, such as by using the system 10 or variations thereof, will be described in greater detail herein.

Patterning A Part

Figure 5:
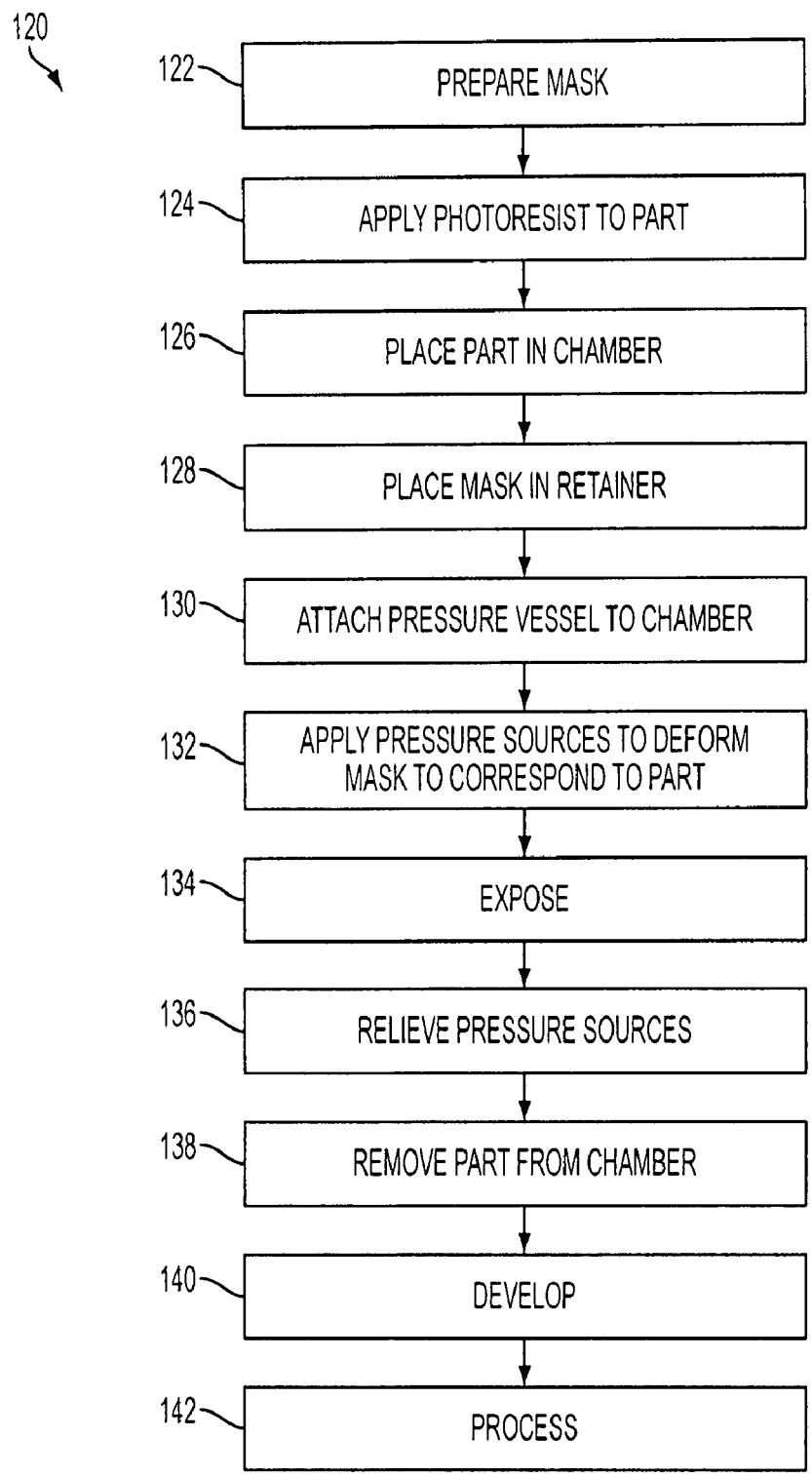
FIG. 5 is a flow chart illustrating a method of patterning a part having a non-planar surface.

With reference to FIG. 5, a method 120 is illustrated, for patterning a part having a non-planar surface, e.g., using the system 10 shown in FIG. 1. For sake of illustration, the part 24 is shown as having a non-planar surface area 24A comprising a relatively deep dimple that includes sharp changes of the surface contour of the part 24 along the perimeter of the dimple. The dimple geometry should not be considered as limiting to the various aspects of the present invention, but rather, is shown to demonstrate that various aspects of the present invention can be utilized to deform a mask 26, e.g., a generally flat substrate as shown, so as to correspond to parts that include complex curves, steep and/or sharp changes in surface contour and other complex configurations.

Initially, a mask 26 is prepared at 122. The activities performed to prepare the mask at 122 may be analogous to those described at 102 to prepare a mask substrate as described with reference to the method 100 shown in FIG. 2. Additionally, a part 24 is coated with photoresist at 124, e.g., using a conventional spin or spray coat process.

At 126, the part 24 having the photoresist coat thereon is placed in the chamber base 12, such as by setting or otherwise securing the part 24 to the platform 18. At 128, the mask 26 is secured in the mask retainer 16 so as to orient the mask 26 proximate to the part 24 toward the photoresist. When the mask 26 is placed in the mask retainer 16, the mask substrate may be optionally stretched in one or more directions. In this regard, the mask 26 may be substantially flat, or the mask 26 may have some shape that is not substantially flat. However, the mask 26 is typically not shaped to conform to the part 24 at this time. At 130, the pressure vessel 14 is attached to the chamber base 12 and/or retainer device 16, and at 132, the pressure sources 20 are utilized within the chamber so as to deform the mask 26 to the shape of the part 24, including any non-planar surface(s) 24A. Also at 132 (or some other appropriate step), the mask 26 may be aligned to the part 24.

Figure 6:
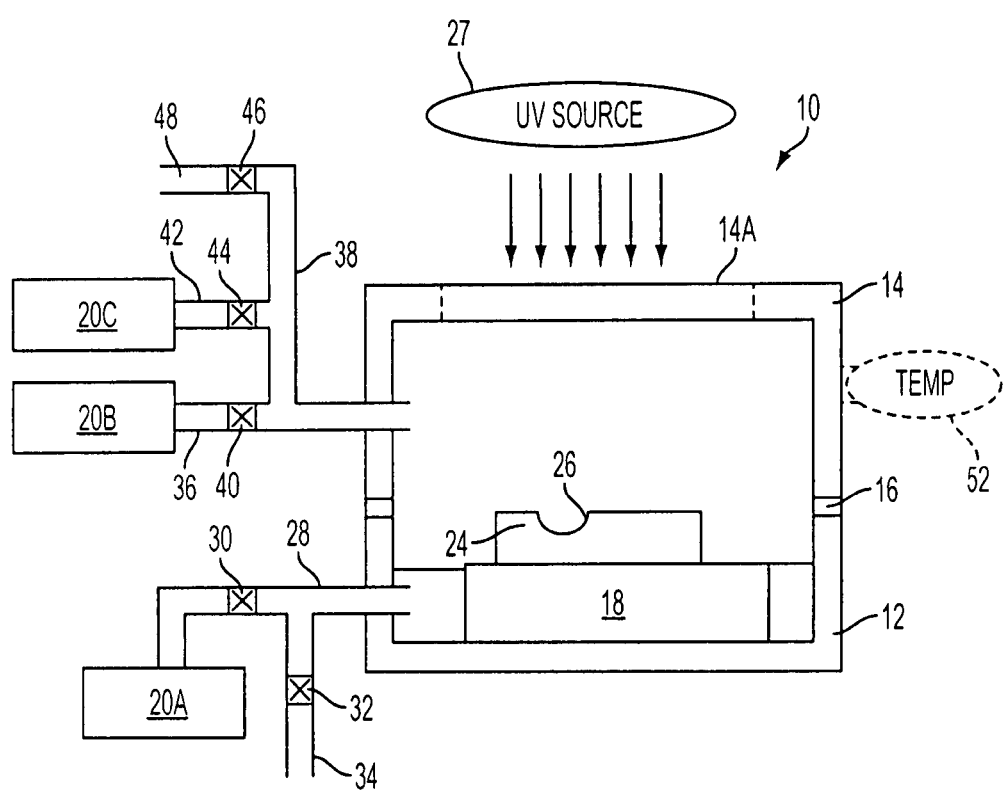
FIG. 6 is a schematic block diagram of the system of FIG. 1 during operation wherein a differential pressure is used to deform the mask corresponding to the shape of a part to be patterned.

Referring to FIG. 6, assume the mask 26 comprises a suitably deformable mask substrate, e.g., an aluminized Mylar mask, and the part 24 includes a non-planar surface area 24A having a dimple there-along as schematically represented in the illustration of an exemplary part as shown. In the illustrated arrangement, the mask 26 and/or mask 26 in cooperation with the retaining device 16, spans a cross-section of the chamber. As such, the mask 26 in cooperation with the retaining device 16 separates the pressure vessel space within the chamber from the chamber base space within the chamber.

As noted above with regard to the discussion of FIG. 1, the first and third pressure sources 20A, 20C may each comprise a vacuum source and the second pressure source 20B may comprise a positive pressure source such as compressed nitrogen. Initially, the first control valve 30 may be opened sufficient to allow the first pressure source 20A to begin drawing a vacuum from the bottom of the chamber. Also, the third control valve 46 may be opened to allow the third pressure source 20C to begin drawing a vacuum from the top of the chamber. As such, the pressure vessel space defines an upper vacuum space and the chamber base space, which contains the part 24, defines a lower vacuum space.

As a vacuum is drawn from both the top and bottom of the mask 26, the pressure may be insufficient to cause the mask 26 to deform to a manner substantially conformal to the part 24. However, drawing a vacuum from both the top and bottom may allow the mask 26 to be aligned, and gas that is trapped between the part 24 and the mask 26 may be evacuated.

As another example, a vacuum may be drawn first in the pressure vessel space, e.g., using the third pressure source 20C. Subsequently, a vacuum may be drawn in the chamber base space below the mask, e.g., using the first pressure source 20A. Next, the pressure vessel space may be vented, such as by closing the third control valve 46 and by temporarily opening the second relief valve 46. The mask 26 can then be pushed or otherwise positioned with respect to the part 24 without trapping air therebetween.

There are a number of approaches to utilizing the pressure sources 20 to deform the mask 26, such as by creating a pressure differential within the chamber. For example, after drawing trapped air and/or suitably aligning the mask 26 over the part 24, the second control valve 40 may be opened, allowing the second pressure source 20B to exert a positive pressure on the mask 26 while a vacuum is maintained in the chamber base space.

Thus, the pressure vessel space may be transformed from the upper vacuum space, to a positive pressure space. The positive pressure on the pressure vessel side of the chamber, and the negative pressure/vacuum on the chamber base side of the chamber will thus cause the mask 26 to deform towards the shape of the part 26. In this regard, the pressure applied by either the first or second pressure sources 20A, 20B may be varied. For example, the first pressure source 20A may be set to a first value when aligning the mask 26 and removing gas from between the part 24 and mask 26, and the first pressure source 20A may be operated at a different pressure for deforming the mask 26.

Still further, one or more of the pressure levels may be periodically and/or continuously adjusted during the exposure operation. For example, the pressure within the chamber may not be sufficient to bring the Mylar mask 26 into intimate contact with the part 24, including the non-planar surface area 24A, e.g., in the "dimple" region as schematically illustrated, when the second pressure source 20B is initially applied. Thus, a pressure from the nitrogen source 20B may be maintained or gradually increased over a period of time to generate a sufficiently high pressure from the vessel side of the mask 26. As nitrogen is introduced into the vessel 14, the Mylar mask 26 will continue to deform, e.g., by stretching down into the dimple in the example. Similarly, the pressure from the vacuum of the first pressure source 20A may be maintained or gradually increased over a period of time to generate a sufficient pressure from the chamber base side of the mask 26. Thus, both the first and second pressure sources 20A, 20B each perform the functions of drawing the mask 26 towards the part 24 and deforming the mask 26 to conform to the part 24. The time to achieve contact will vary depending on factors such as the geometry of the part, the ability of the mask 26 to deform, etc.

When there is sufficient contact between the part 24 and the mask 26, there may be a visible difference between the areas with good contact and no contact. For example, in one exemplary arrangement, an aluminized Mylar mask was used to pattern a part having a dimple. As complete contact between the part 24 and the Mylar mask 26 approached, fringe patterns were visually detected that became increasingly visible.

In the example described above with reference to FIGS. 5 and 6, the first, second and third pressure sources 20A, 20B, 20C are utilized in a suitable combination, e.g., using differential pressure to deform the mask 26 to substantially conform to the part 24, including the non-planar surface area 24A. Depending upon the mask material, the temperature of the system 10 may also be controlled, monitored or otherwise maintained within predetermined target range(s) by a temperature control system 52, e.g., to assist in the deformation of the mask 26 to conform to the part 24, or to establish conditions in which the mask material is deformable. For example, a photosensitive mask material may deform at temperatures of less than about 50° C., which may be desirable, for example, where the part 24 cannot be exposed to elevated temperatures. Alternatively, the mask 26 and/or the system 10 may be heated to assist in deforming the mask 26 to the part 24. As such, FIG. 6 schematically shows that the mask 26 has recessed down into the non-planar surface area 24A, i.e., the dimple as shown, of part 24.

With reference to FIGS. 5 and 6, once suitable deformation of the mask 26 is achieved relative to the part 24, an exposure operation is performed at 134 while the mask 26 is held in a deformed state, e.g., in a state that is substantially conformed to the shape of the part 24 as shown. Keeping with the above example, once the Mylar mask 26 is in sufficiently complete contact with the surface of the part 24, which may be determined for example, based upon the precision and required feature size of the pattern, the setup is ready for exposure. To expose the photoresist through the deformed mask 26, the system 10 is positioned such that the pressure vessel 14 is under the UV lamp. When determining exposure times, it may be necessary to account for factors such as the attenuation of the light as a result of the material of the pressure vessel 14, which may filter the UV light. During the exposure, both the first and second pressure source 20A, 20B may remain on to ensure that maximum contact between the part 24 and the mask 26 is maintained.

After exposure, pressure sources 20 are relieved at 136, e.g., using the first relief control valve 32 and first relief passageways 34, and/or the second relief control valve 46 and second relief passageway 48. The part 24 is then removed from the chamber base 12 at 138, e.g., after pressure in both the chamber base 12 and the vessel 14 are returned to atmosphere. A development process is performed at 140 to remove the photoresist in one of the exposed or unexposed regions of the photoresist, e.g., using conventional techniques. For example, the part 24 may be baked during a post exposure bake. Once the part 24 has been (optionally) baked and is cool, the part 24 may be developed. Still further, depending upon the nature of the part 24, it may be necessary to perform a post pattern inspection, e.g., to detect whether there are regions where the resist has not totally developed away and/or to detect whether there are areas of very small cracks in the opaque layer of the mask that were imaged onto the lines, etc. Such types of potential problems may be taken care of by additional developing, e.g., with a higher concentration developer applied only in the areas that require the additional developing. Once developed, additional processing steps may be performed as the specific application dictates.

The necessary processing for completing the part 24 is then performed at 142. For example, if a conductive pattern is to be applied to the part 24 via a lift off technique, the part 24 is then coated with a conductive layer, e.g., by conformally coating the part 24 with a conductive material. Where the photoresist has been removed, the conductive material will contact the part 24. Alternatively, the conductive layer will form above the photoresist that remains on the part 24. Depending on the uniformity requirements and the geometry of the part, tooling and rotation schemes may needed to suitably coat the part.

A lift off operation is then performed to remove the remaining photoresist from the part 24, and hence the conductive material on the photoresist. When the part 24 is conformally coated with the conductive material, a thin steep wall of conductive material will form between the layer of conductive material on the photoresist and the layer of conductive material on the surface of the part 24. When the photoresist is removed, e.g., by spraying or submerging the part with a suitable solvent solution, the thin, steep walls of conductive material will break, releasing the remaining photoresist and corresponding conductive material that was layered over the photoresist. However, the conductive material applied to the surface of the part 24 remains adhered to the part 24.

As an alternative to the lift off technique, an etch process may be utilized, e.g., by applying a conductive coating to the part 24 before applying the photoresist to the part 24 at 124. In this example, after developing the photoresist, a conventional etch process may be utilized to etch away the conductive material exposed after developing the photoresist.

As yet a further example, the processing at 142 may comprise any type of treatment that could be selectively applied to the substrate corresponding to the photoresist pattern. This process could include wet etching such as with HF or dry etching such as RIE or a process like ion implantation where the substrate is modified by the addition of other materials into the substrate. If the photoresist was opaque enough to UV light, the sample could be hydrogen loaded and exposed with UV light to modify the index of refraction forming a waveguide as an example. Thus, subsequent operations involving metal pattern formation is not required.

It may be necessary to remove trapped air bubbles between the part 24 and the mask 26. According to an aspect of the present invention, some air bubbles may be eliminated between the part 24 and the mask 26 before performing the exposure operation by pushing air from the center to the edges and out of the contact area, e.g., using standard laminating techniques. Once the air bubbles are suitably removed from between the part 24 and the mask 26, the first and second vacuum sources 20A and 20B (or some other combination of pressure sources 20) may be used to deform the mask 26 according to the part 24 in the chamber.

In an illustrative example, the area above the mask 26, e.g., the pressure vessel space, may be first evacuated to define a negative pressure space and then the air below the mask 26, e.g., the chamber base space, may be evacuated. Next, the pressure vessel space above the mask 26 may be vented. As such, the mask 26 can be pushed around for positioning and alignment without trapping air between the part 24 and the mask 26.

As yet another illustrative example, a vacuum may be applied to both the chamber base 12 and the vessel 14 more or less simultaneously to prevent deformation of the mask until the mask 26 is suitably aligned with the part 24 as described more fully above. Once the mask 26 is aligned to the part 24, the two vacuum sources, e.g., pressure sources 20A and 20C can be utilized to create a pressure differential sufficient to deform the mask 26 to conform to the part 24. As yet another example, the pressure vessel space can be evacuated and replaced with a positive pressure, as described more fully herein.

Mechanical Approaches to Aid in Deforming the Mask for Patterning a Part

Pre-shaping of the mask 26 may be useful, such as to reduce the time required to deform the mask 26 in the system 10 and/or to complete the required deformation of the mask 26. The mask 26 may be mechanically deformed after the mask 26 has been patterned and before and/or during use of the mask 26 in patterning a part 24.

Figure 7:
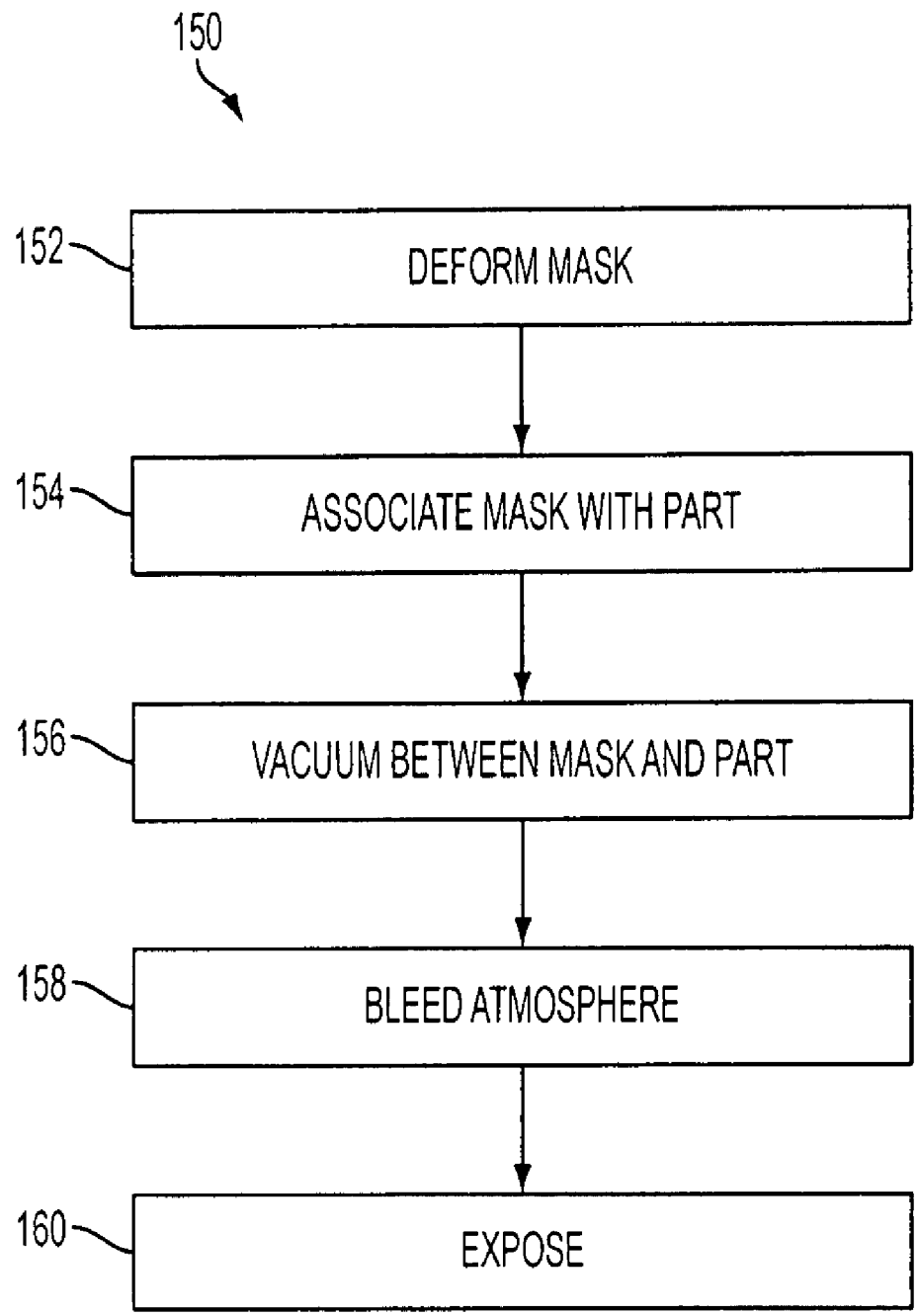
FIG. 7 is a flow chart illustrating an exemplary approach for patterning a part having a non-planar surface area.

Referring to FIG. 7, a method 150 illustrates yet another exemplary method of performing an exposure operation for a part having a non-planar surface area. A mask 26 having a desired pattern thereon is deformed at 152. The mask is associated with a part to be exposed at 154 and a vacuum is pulled between the mask and the part at 156. After pulling the vacuum, the method may optionally bleed the space adjacent to the mask and opposite of the part 24 to atmosphere at 158. For example, where using a system such as that described with reference to FIGS. 1 and 5, the pressure vessel space may be evacuated to draw the mask to a corresponding mold to deform the mask 26. Once the mask 26 is suitably mated with the part 24, the system may bleed the pressure vessel space. The part 24 is then exposed at 160 through the mask 26.

The optional step at 158 to bleed the space adjacent to the mask 26 to atmosphere provides flexibility in the manner in which the exposure at 160 is implemented. For example, when using a two part chamber, such as that described with reference to FIG. 1, after bleeding the space adjacent to atmosphere, the pressure vessel 14 can be removed from the chamber base.

Figure 8:
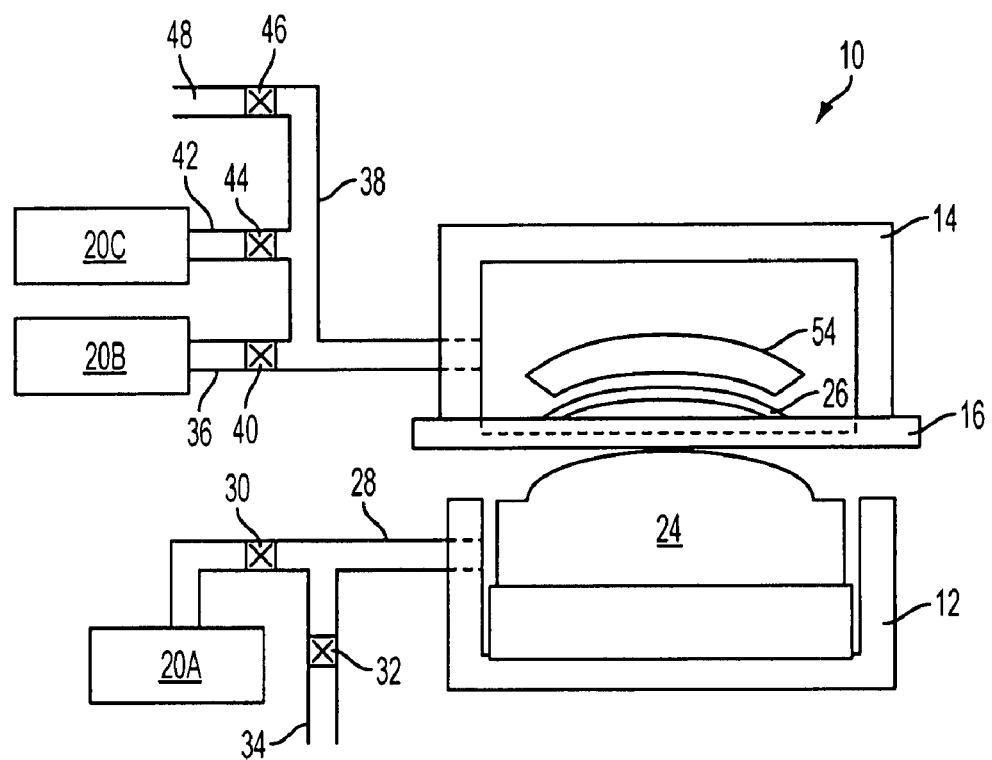
FIG. 8 is an apparatus for patterning a part according to the flow chart of FIG. 8, wherein the apparatus is in a first state.

Referring to FIG. 8, the system 10 may be used to perform the method describe in FIG. 7. As shown, a mold 54 is provided in the pressure vessel 14 above the mask 26. In a first state, system 10 comprises the deformable mask 26 secured to the retaining device 16, which is coupled to the pressure vessel 14. The chamber base 12 may be optionally secured to the pressure vessel 14 and/or retaining device 16. A vacuum is pulled, e.g., using the third pressure source 20C, to deform the mask upward against the mold. For example, as noted above, the mask 26 and/or mask 26 in cooperation with the retaining ring 16 divide the chamber space into a pressure vessel side and a chamber base space. By pulling a vacuum in the pressure vessel space (or upper vacuum space in the system as illustrated), the mask 26 can be deformed to the shape of the mold 54. In this regard, the mold 54 may take a shape that is complimentary to the desired non-planar surface area 24A of the part 24, or the mold 54 can take some other shape.

If necessary, the chamber base 12 is mated with the pressure vessel 14, the mask 26 is brought down in cooperation with the part 26 to be exposed and a vacuum is pulled between the mask 26 and the part 24, e.g., using the first pressure source 20A. When a sufficient vacuum has been pulled, the second relief control valve 46 may be opened to bleed the pressure vessel 14 to atmosphere. Thus, the system bleeds atmosphere into the upper vacuum space above the mask 26. However, the vacuum drawn between the part 24 and the mask 26 remains so that the mask is deformed to the part 24, including a non-planar surface of the part 24.

Figure 9:
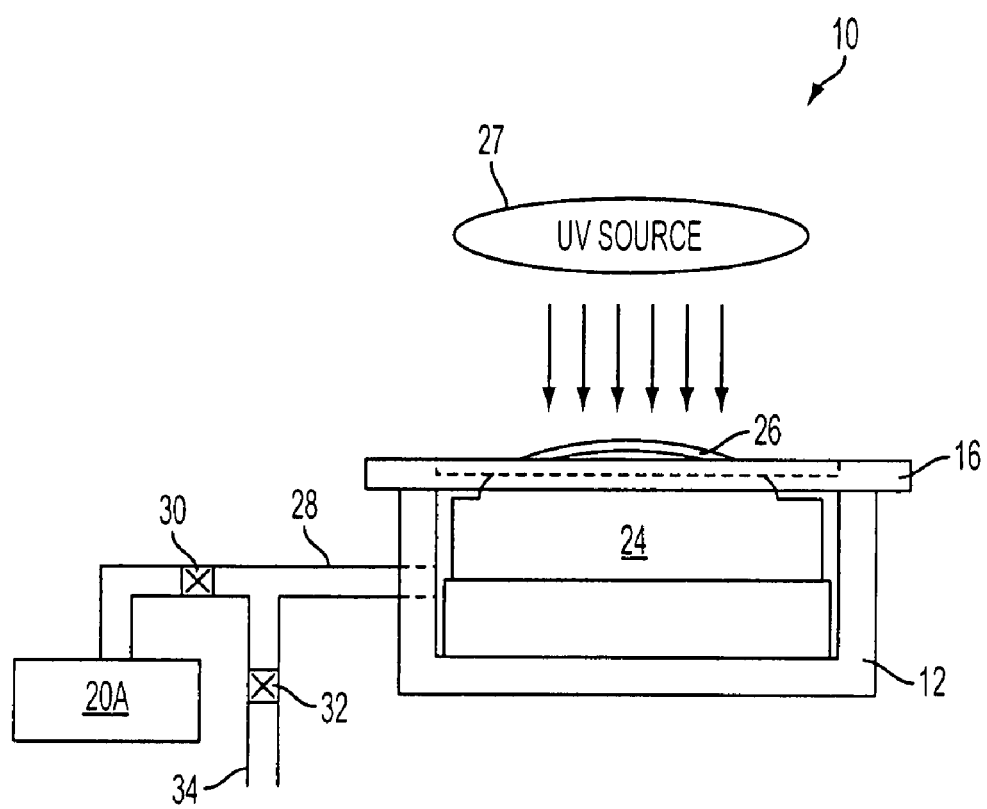
FIG. 9 is the apparatus for patterning a part according to the flow chart of FIG. 8, wherein the apparatus is in a second state.

Referring to FIG. 9, under these conditions, it may now be possible orient the system 10 to a second state, wherein the pressure vessel 14 is removed from the chamber base 12. The mold 54 may also be removed from association with the mask 26. Alternatively, the mold 54 may remain, such as where the mold is transmissive to the light from the exposure source 27. As such, an exposure operation may be performed by exposing the part 24 through the mask 26, such a by using a suitable UV exposure source 27. In this regard, the exposure source 27 does not have expose the part through a window or other suitable portion 14A of the pressure vessel 14. As noted in the discussion with reference to FIGS. 8 and 9, the pressure sources 20 need not be operated simultaneously to create a differential pressure. Rather, the pressure sources 20 may alternatively be operated in a sequential manner.

As another example, a mechanical force may be used as an alternative to and/or to assist the pressure created in the chamber of the system 10, e.g., to reduce the required pressure to deform the mask 26 so as that the mask 26 achieves sufficient intimate contact with the part 24 for exposure.

Figure 10:
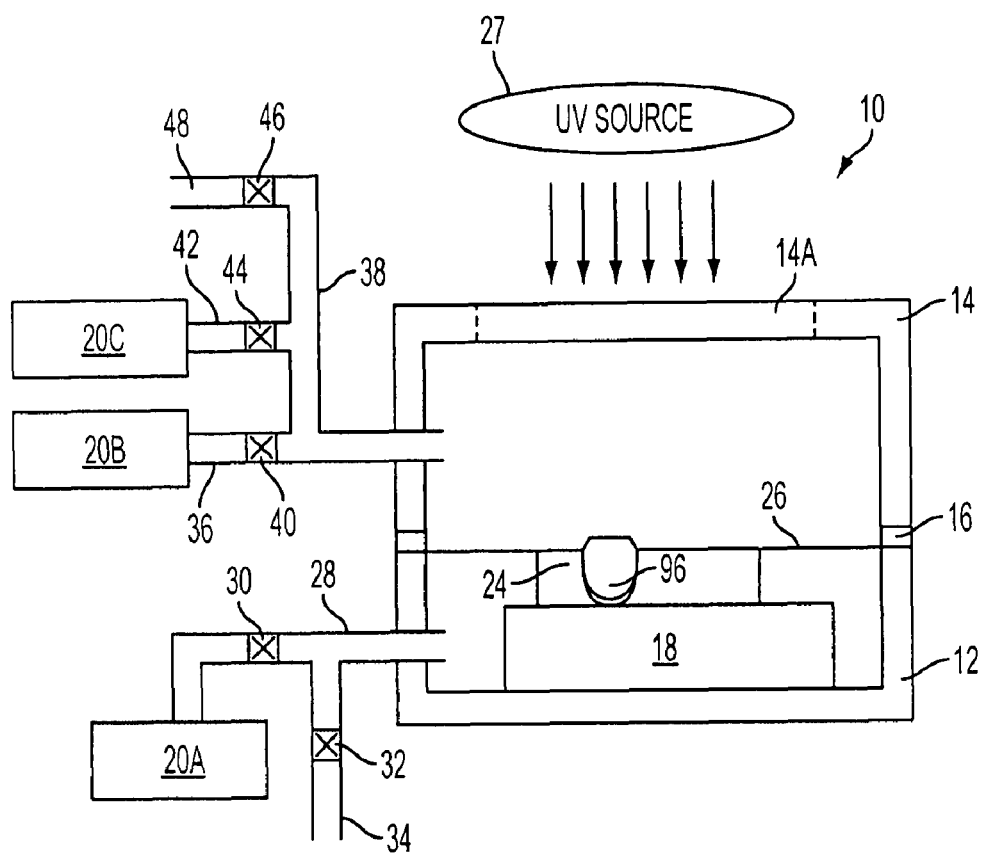
FIG. 10 is a schematic diagram of a system for performing an exposure on a part having a non-planar surface.

Referring to FIG. 10, a mechanical backing device 96, e.g., a moldable foam or other suitable material or composite, is utilized to apply mechanical pressure to the mask 26 so as to achieve (or assist in achieving) intimate contact between the part 24 and the mask 26. In the illustrated example, the mask 26 is essentially sandwiched between the part 24 and the backing device 96. As shown, the backing device 96 is dimensioned to correspond to the dimple (or any other suitable non-planar surface 24A of the part 24). The backing device 96 may conform to the shape of the part 24 or the non-planar surface area 24A of the part 24, or the backing device may have a simple or complex shape that is different from the part 24 or the non-planar surface area 24A of the part 24. Regardless, the backing device 96 essentially applies a mechanical force to assist in the deformation of the mask 26. The backing device may be transmissive to light from the exposure source 27, e.g., if the backing device 96 remains in the chamber during exposure.

Figure 11:
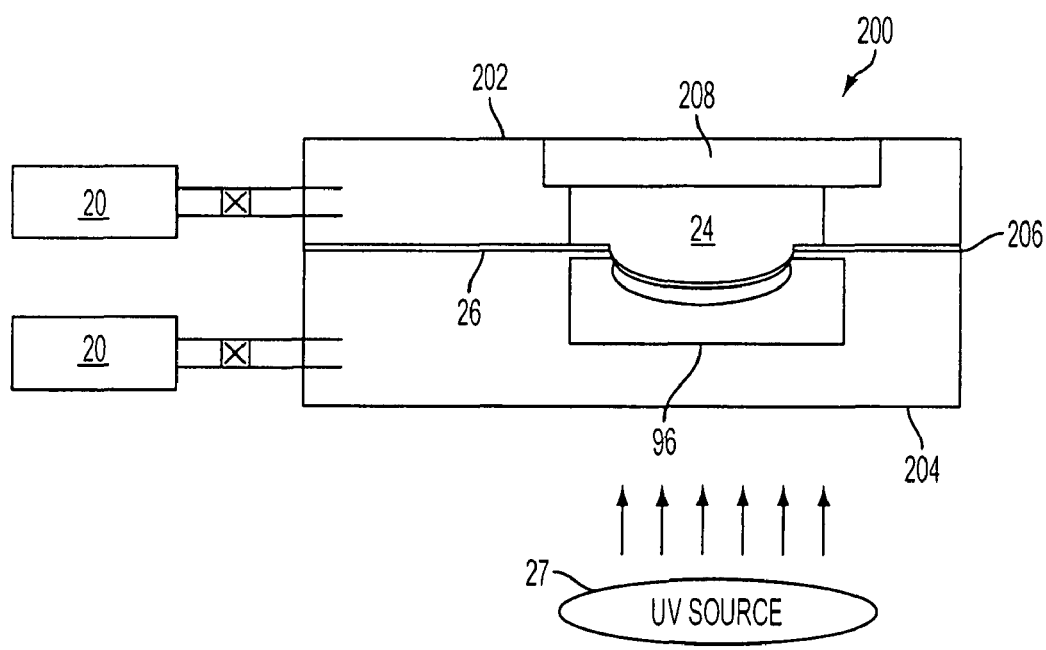
FIG. 11 is a schematic diagram of a system for performing an exposure on a part having a non-planar surface.

Referring to FIG. 11, the system need not position the mask 26 above part 24 as shown in FIG. 1. For example, an exposure operation may be performed from the bottom of a suitable chamber utilizing the system 200. As shown, a chamber comprises a chamber base 202 on a top portion of the chamber and a pressure vessel 204 on a bottom portion of the chamber. A retaining device 206 is utilized to secure the mask 26 within the chamber of the system 200. The part 24 is secured to a platform 208 and is situated just above the mask 26, which is held by the retaining device 206. The part 24 is positioned within the chamber so that a non-planar surface area 24A, e.g., a convex surface profile, is directed towards the mask 26. The pressure sources 20 are then operated to bring the mask 26 into contact with the part 24 sufficient for exposure. For example, as noted in greater detail above, a pressure differential may be applied by two or more pressure sources 20 to bring the mask 26 into contact with the part 24 sufficient for exposure.

Further, a mechanical device, such as the optional backing device 96 may be positioned under the mask 26, e.g., so as to press the mask 26 up against the part 24 and/or to provide suitable support to the part 24. Once the appropriate pressure (s) have been established by the pressure source(s) 20, the backing device 96 may be left in place, e.g., where the backing device 96 is transmissive the exposure source 27, or the backing device 96 may be removed, e.g., after a vacuum has been drawn and the mask 26 is sufficiently conformal to the part 24.

Figure 12:
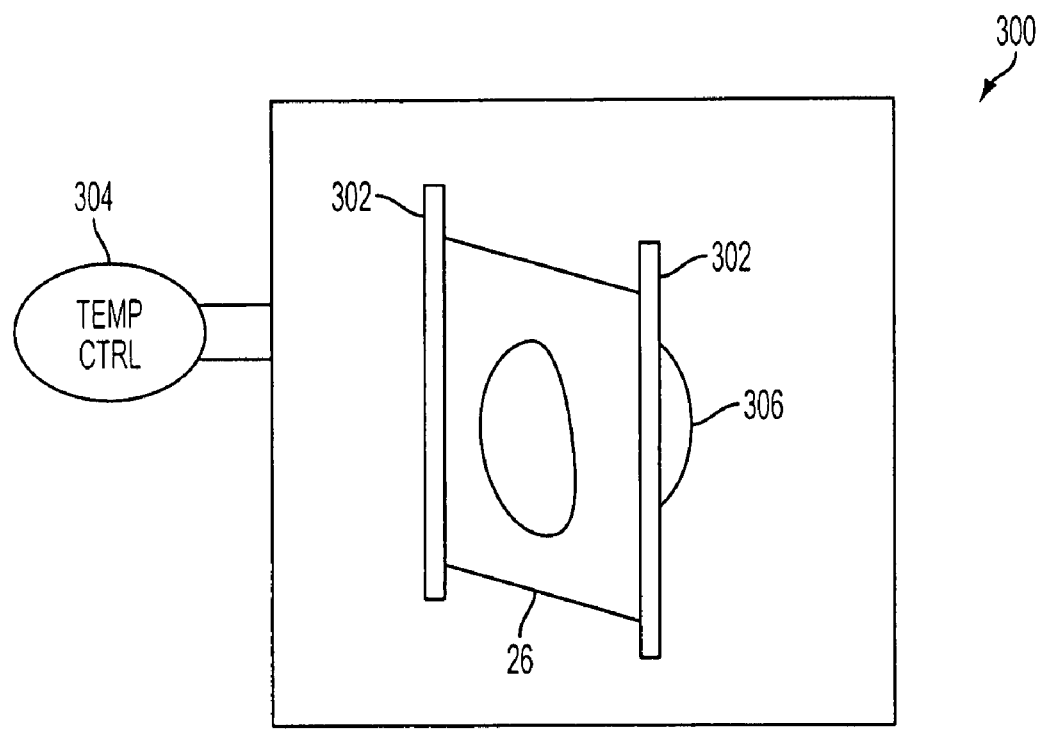
FIG. 12 is a schematic diagram of an exemplary system for shaping a mask.

Referring to FIG. 12, another exemplary system 300 is illustrated, that utilizes mechanical deformation of the mask 26. The mask 26 may be patterned as a substantially flat sheet, e.g., using the techniques described above. In this example, the flexible sheet defining the mask substrate is held by a pair of plates 302 and is heated by a temperature control 304 while a desired shape 306, e.g., a copy of the part 24, a spherical object or other object having any desired shape, is pressed into the sheet. The system 300 may be separate from the system 10 used to pattern the part 24. Alternatively, the system 300 may be integrated into the system 10, e.g., using the retaining device 16 to function as the plates 302. The patterned flexible material forms to the desired shape by stretching or a combination of shrinking and stretching. The heat is removed and the sheet is allowed to cool while still being held in position. In this context, the desired shape may comprise a basic shape, or a more complex shape, e.g., an approximation of the corresponding part 24 to be patterned.

Figure 13:
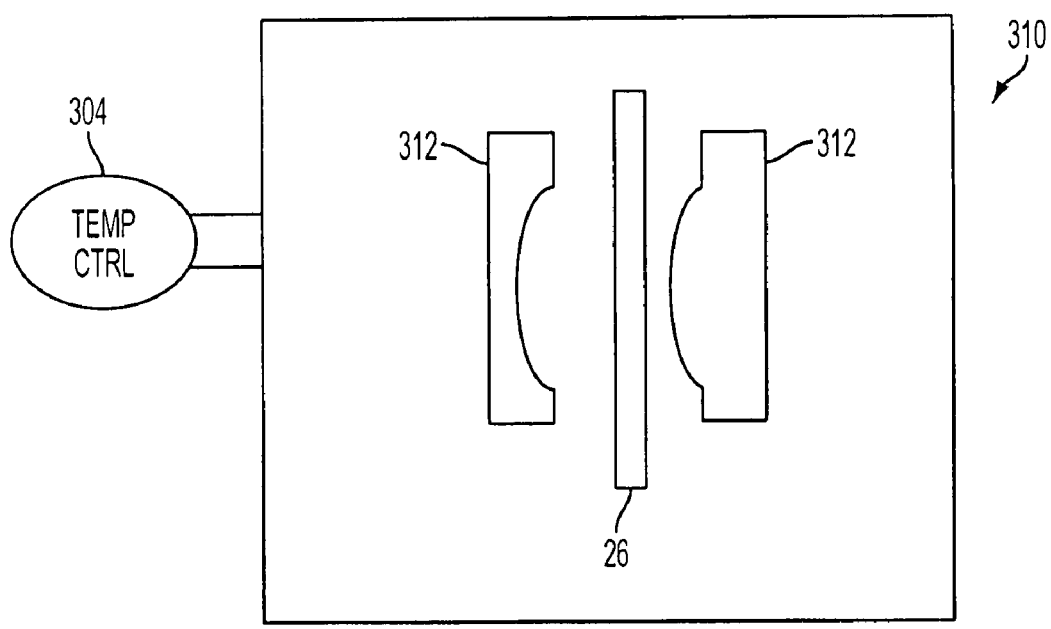
FIG. 13 is a schematic diagram of another exemplary system for shaping a mask.

Referring to FIG. 13, the previously patterned mask 26 may alternatively be mechanically deformed using a molding system 310. The mask 26, is placed, e.g., while in a flat or substantially flat shape, within a mold 312, e.g., consisting of first and second complimentary blocks as shown. The mask 26 may be deformed by a combination of stretching and/or shrinking while in the mold. Further, the deformation of the shape of the mask 26 may be assisted while in the molding system 310, using temperature control 304, a chemical treatment or other suitable accelerant. In this context, the desired shape of the mold 312 may comprise a basic shape, or a more complex shape, e.g., an approximation of the corresponding part 24 to be patterned. Other shaping techniques may alternatively be used.

Using the Part as the Mask

Figure 14:
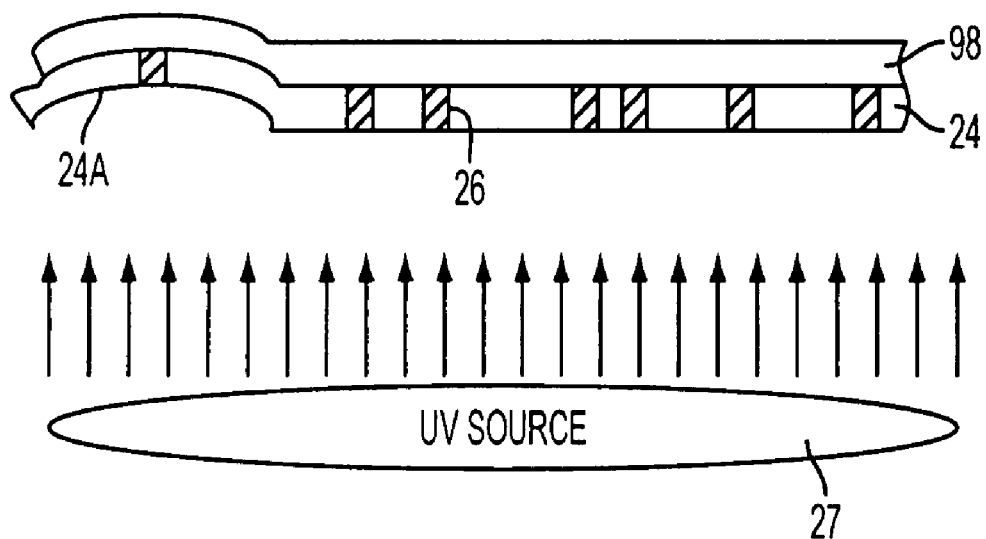
FIG. 14 is a schematic illustration of an exemplary approach where the part to be patterned is used as the mask for an exposure operation.

Referring to FIG. 14, under certain circumstances, it may be possible to form the part so that the part itself is the mask 26. For example, a part 24 is coated with a layer of photoresist 98. The part 24 is infiltrated or otherwise treated, e.g., using photodarkening techniques, varnish, paint or other suitable treatments that coat or otherwise penetrate the part substrate in a manner such that the pattern is permeated through the part thus defining areas of the part itself that are transmissive to the exposure source 27, and areas that are not transmissive to the exposure source 27. As some examples, the part substrate may be transmissive to light from the exposure source. As such, a paint, varnish or other opaque material may be applied to the surface of the part to define areas that are non-transmissive to the exposure source. As another example, a substrate of the part may be transmissive to the exposure source except where the substrate is infiltrated with a treatment that renders the infiltrated areas non-transmissive to the exposure source. As yet a further example, the part substrate may be non-transmissive to the exposure source except where the substrate is infiltrated with a treatment that renders the infiltrated areas transmissive to the exposure source 27.

As an example, the various techniques described in U.S. Provisional Application Ser. No. 60/822,134 filed Aug. 11, 2006, entitled "PATTERNING COMPOSITIONS, MASKS AND METHODS" may be utilized to fashion the mask 26 integral with the part 24 itself. The exposure source 27 is then used to expose the photoresist 98 through the part 24 without requiring a separate, detached deformable mask 26. After exposure, a development operation is performed to remove portions of the photoresist 98 and any desired subsequent processing of the part 24 may be performed.

Gas Permeable Mask

In the design of a deformable (or even flexible or rigid) mask 26, it may be difficult to obtain sufficiently intimate contact with the corresponding part 24 in the non-planar surface area 24A of the part 24. For example, when the mask 26 is aligned over the part 24, there is a risk of trapping air and corrupting intimate contact in local regions in the contact area between the part 24 and the mask 26, thus affecting the quality of the exposure.

In certain applications, trapped air is difficult to avoid. However, it may be unacceptable due to manufacturing constraints, e.g., feature size, to allow the air bubbles to remain. According to one aspect of the present invention, the mask 26 is constructed from a substrate material that is gas permeable so that intimate contact with the final part 24 may be facilitated by providing a means for the air bubbles to escape.

As an example, the mask 26 may comprise a polymer. Thus, any gas, such as helium, that is permeable to the polymer may be used in the system 10. According to an aspect of the present invention, helium is used as an intentional atmosphere during contact lithography. Helium is a relatively small molecule that is readily available. If the contact region between part 24 and the mask 26 is purged of other gases and is substantially filled with helium, then any trapped gas would be able to permeate the polymer mask 26. Thus, evacuating the area between the part 24 and the mask 26 may not be entirely necessary if the region can simple be purged with helium or another permeable gas. Moreover, this eliminates the potential for errors in the standard lamination techniques to minimize trapped air where a gas is used that can permeate the mask 26. The gas permeable mask 26 may be used, for example, with the assistance of a mechanical backing device 96, and/or with other techniques and systems such as those described more fully herein.

The present invention is described below with reference to flowchart illustrations and/or block diagrams of methods and apparatus (systems). It will be understood that each block of the flowchart illustrations and/or block diagrams, and combinations of blocks in the flowchart illustrations and/or block diagrams may be implemented and/or controlled by computer program instructions. For example, a computer may be used to control exposure times, to control the pressure sources 20, including the relief valves, etc., to control automation of devices such as the translation stage 78 described with reference to FIG. 4, etc. These computer program instructions may be provided to a processor of a general purpose computer, special purpose computer, or other programmable data processing apparatus.

The flowchart and block diagrams in the Figures illustrate the architecture, functionality, and operation of possible implementations of systems and methods according to various embodiments of the present invention. In this regard, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having thus described the invention of the present application in detail and by reference to preferred embodiments thereof, it will be apparent that modifications and variations are possible without departing from the scope of the invention defined in the appended claims.

What is claimed is:

1. A method of forming a pattern on a complex non-planar surface of a part comprising:
    forming a layer of photoresist on a part having a surface comprising a complex non-planar surface area;
    positioning said part within a chamber defined by a chamber base and a pressure vessel such that said part is positioned within said chamber base, wherein a first pressure source is coupled to said chamber base and a second pressure source is coupled to said pressure vessel;
    securing a deformable mask in a retaining device between said chamber base and said pressure vessel so as to align said deformable mask towards said photoresist on said part and divide said chamber into a pressure vessel space above said mask and a chamber base space below said mask;
    drawing a first vacuum in said chamber base space using said first pressure source;
    applying a positive pressure in said pressure vessel space using said second pressure source to deform said mask to correspond substantially to said part including said complex non-planar surface area;
    exposing said photoresist on said part through said mask after said mask deforms to correspond to said part including said complex non-planar surface area;
    removing said part from said chamber; and
    developing said photoresist on said part.

2. The method according to claim 1, wherein a third pressure source is coupled to said pressure vessel, further comprising:
    drawing a second vacuum in said pressure vessel space using said third pressure source before drawing said first vacuum in said chamber base space;
    venting said pressure vessel space while maintaining the vacuum in said chamber base space; and
    performing at least one of evacuating gas trapped between said part and said mask and repositioning said mask relative to said part.

3. The method according to claim 1, wherein a third pressure source is coupled to said pressure vessel, further comprising:
    drawing a second vacuum in said pressure vessel space using said third pressure source substantially simultaneously with drawing said first vacuum in said chamber base space to prevent deformation of said mask; and
    performing at least one of evacuating gas trapped between said part and said mask and repositioning said mask relative to said part.

4. The method according to claim 1, wherein said applying a positive pressure in said pressure vessel space comprises:
    applying said positive pressure simultaneously with drawing said first vacuum in said chamber base space to create a differential pressure to deform said mask to correspond substantially to said part including said complex non-planar surface area.

5. The method according to claim 1, wherein said applying a positive pressure in said pressure vessel comprises:
    deforming said mask within a range corresponding to the elastic limits of said deformable mask such that said deformable mask returns generally to a first shape upon removal of said first and second pressure sources, said first shape not conformal to said non-planar surface area of said part.

6. The method according to claim 1, further comprising pre-shaping said mask using a mechanical backing device to temporarily deform said mask within said chamber.

7. The method according to claim 6, wherein said exposing said photoresist on said part further comprises exposing said part through said mask and said mechanical backing device.

8. The method according to claim 1, further comprising selecting said mask to have a substrate that is permeable to a gas used for atmosphere when exposing said photoresist.

9. A method of forming a pattern on a complex non-planar surface of a part comprising:
    deforming a mask against a mold;
    bringing said mask into cooperation with a part to be patterned while said mask is deformed against said mold, wherein said part has at least one complex non-planar surface area coated with a photoresist layer;
    pulling a vacuum between said mask and said part such that said mask deforms to said part including said at least one complex non-planar surface area;
    removing said mold from said mask so that said mask remains deformed to said part;
    exposing said part through said mask; and
    developing said part.

10. The method according to claim 9, further comprising installing said deformable mask in a pressure vessel, wherein:
    said deforming a mask against a mold comprises drawing a vacuum between said mask and said mold in said pressure vessel to define an upper vacuum space.

11. The method according to claim 10, further comprising installing said part in a chamber base, and coupling the pressure vessel to the chamber base, wherein said pulling a vacuum between said mask and said part such that said mask deforms to said part including said at least one non-planar surface area comprises pulling said vacuum in said chamber base so as to pull said mask to said part.

12. The method according to claim 11, further comprising:
bleeding atmosphere into said upper vacuum space such that said mask remains deformed against said part; and
uncoupling said pressure vessel from said chamber base such that said mask remains deformed against said part, wherein said exposing said part through said mask comprises exposing said part without interference of said pressure vessel.

13. The method according to claim 12, further comprising: removing said mold before exposing said part.

14. A method of making a deformable mask for contact lithography comprising:
applying photoresist over a deformable mask substrate;
shaping said mask substrate to a first predetermined shape by wrapping said mask substrate about a frame;
applying a master having desired artwork thereon over said photoresist on said deformable mask substrate;
exposing said photoresist using an exposure source to define a desired pattern while said deformable mask is in said first predetermined shape; and
forming said pattern in said photoresist by removing portions of said photoresist corresponding to a desired pattern, wherein said deformable mask does not retain a shape corresponding to a part having a complex non-planar surface area to be patterned by said deformable mask when in a default state, but does deform to correspond substantially to said part including said complex non-planar surface area during patterning said part.

15. The method according to claim 14, wherein said exposing said photoresist using an exposure source to define a desired pattern comprises:
indexing at least one of said frame or said exposure source such that said photoresist is substantially uniformly exposed.

16. The method according to claim 15, wherein said indexing at least one of said frame or said exposure source such that said photoresist is substantially uniformly exposed comprises:
positioning an exposure device in a fixed location;
directing a light beam emitted from said exposure device to a reflective device; and
translating said reflective device so as to substantially uniformly expose said photoresist.

17. The method according to claim 15, wherein said indexing at least one of said frame or said exposure source such that said photoresist is substantially uniformly exposed comprises:
positioning an exposure device in a fixed location;
directing a light beam emitted from said exposure device to a reflective device;
translating said reflective device in a longitudinal direction; and
rotating said frame about said longitudinal axis.

18. The method according to claim 14, further comprising drawing a vacuum to secure said mask substrate and said master to said frame.

* * * * *